United States Patent
Kao et al.

(10) Patent No.: US 10,535,697 B2
(45) Date of Patent: *Jan. 14, 2020

(54) STRUCTURE AND METHOD FOR 3D IMAGE SENSOR

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Chun-Chieh Chuang, Tainan (TW); Feng-Chi Hung, Hsin-Chu County (TW); Shuang-Ji Tsai, Tainan (TW); Jen-Shyan Lin, Tainan (TW); Shu-Ting Tsai, Kaohsiung (TW); Wen-I Hsu, Tainan (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 76 days.

This patent is subject to a terminal disclaimer.

(21) Appl. No.: 15/803,913

(22) Filed: Nov. 6, 2017

(65) Prior Publication Data
US 2018/0061880 A1 Mar. 1, 2018

Related U.S. Application Data

(63) Continuation of application No. 15/383,924, filed on Dec. 19, 2016, now Pat. No. 9,812,487, which is a
(Continued)

(51) Int. Cl.
*H01L 27/14* (2006.01)
*H01L 27/146* (2006.01)
*H01L 31/02* (2006.01)

(52) U.S. Cl.
CPC .... *H01L 27/14636* (2013.01); *H01L 27/1461* (2013.01); *H01L 27/1462* (2013.01);
(Continued)

(58) Field of Classification Search
CPC ... H01L 2924/00014; H01L 2224/9212; H01L 27/14636; H01L 2924/00; H01L 27/1464;
(Continued)

(56) References Cited

U.S. PATENT DOCUMENTS 8,163,581 B1 4/2012 Or-Bach et al.
9,059,061 B2 6/2015 Kao et al.
(Continued)

*Primary Examiner* — Robert G Bachner
(74) *Attorney, Agent, or Firm* — Haynes and Boone, LLP

(57) ABSTRACT

An image sensor structure that includes a first semiconductor substrate having a plurality of imaging sensors; a first interconnect structure formed on the first semiconductor substrate; a second semiconductor substrate having a logic circuit; a second interconnect structure formed on the second semiconductor substrate, wherein the first and the second semiconductor substrates are bonded together in a configuration that the first and second interconnect structures are sandwiched between the first and second semiconductor substrates; and a backside deep contact (BDCT) feature extended from the first interconnect structure to the second interconnect structure, thereby electrically coupling the logic circuit to the image sensors.

20 Claims, 5 Drawing Sheets

Related U.S. Application Data continuation of application No. 14/739,514, filed on Jun. 15, 2015, now Pat. No. 9,525,003, which is a continuation of application No. 14/143,848, filed on Dec. 30, 2013, now Pat. No. 9,059,061.

(60) Provisional application No. 61/799,113, filed on Mar. 15, 2013.

(52) U.S. Cl.
CPC .... *H01L 27/1469* (2013.01); *H01L 27/14634* (2013.01); *H01L 27/14641* (2013.01); *H01L 27/14643* (2013.01); *H01L 27/14685* (2013.01); *H01L 27/14689* (2013.01); *H01L 31/02005* (2013.01)

(58) Field of Classification Search
CPC . H01L 2224/80896; H01L 2224/80001; H01L 23/481; H01L 27/14634; H01L 27/1463; H01L 27/14685; H01L 21/76898; H01L 27/14689; H01L 2224/82; H01L 27/14621; H01L 27/14643; H01L 2224/821; H01L 27/1469; H05K 3/467; A61N 1/3931; A61N 1/3987; H04N 5/3696; H04N 5/374; H04N 9/045; H04N 3/155; H04N 5/332; H04N 5/37457; H04N 5/378; G02B 1/11; G02B 6/4295; G02B 6/43; G03B 13/36
See application file for complete search history.

(56) References Cited

U.S. PATENT DOCUMENTS

| | | |
|---|---|---|
| 9,525,003 B2 | 12/2016 | Kao et al. |
| 2008/0237591 A1 | 10/2008 | Leedy et al. |
| 2013/0009321 A1 | 1/2013 | Kagawa et al. |
| 2014/0035083 A1 | 2/2014 | Wan et al. |
| 2014/0264508 A1 | 9/2014 | Kao et al. |
| 2015/0279893 A1 | 10/2015 | Kao et al. |
| 2017/0098679 A1 | 4/2017 | Kao et al. |

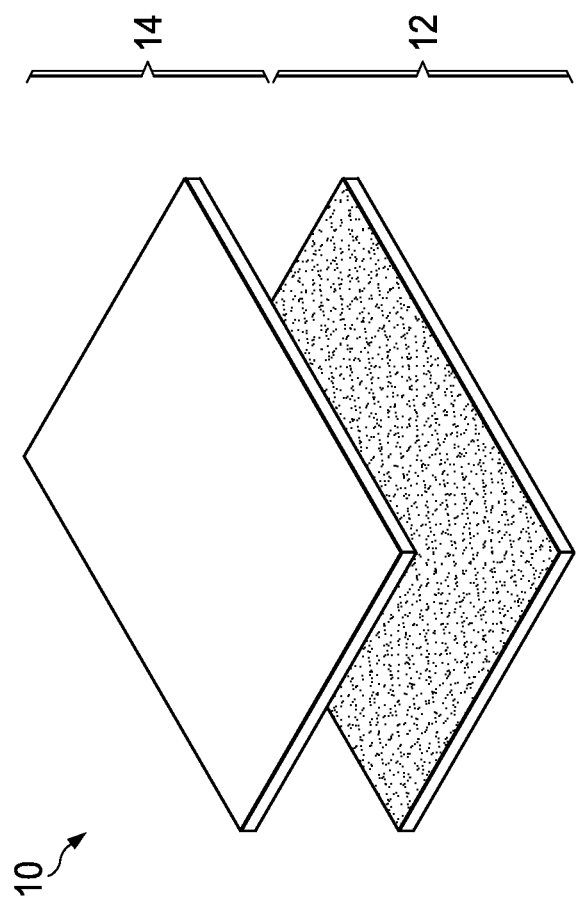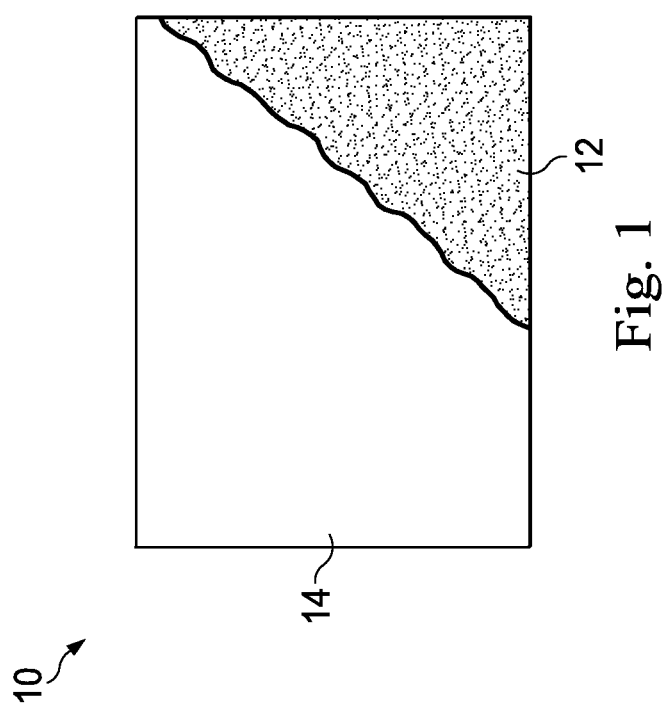

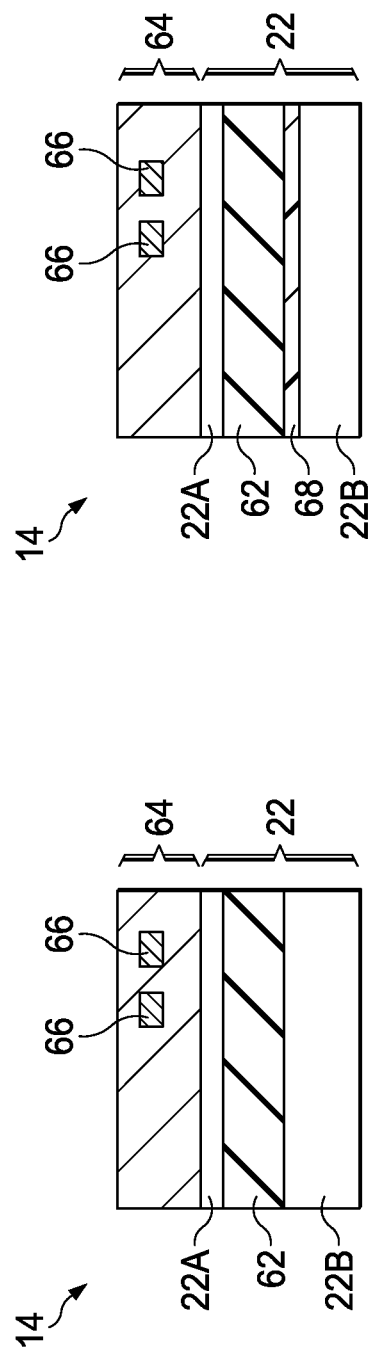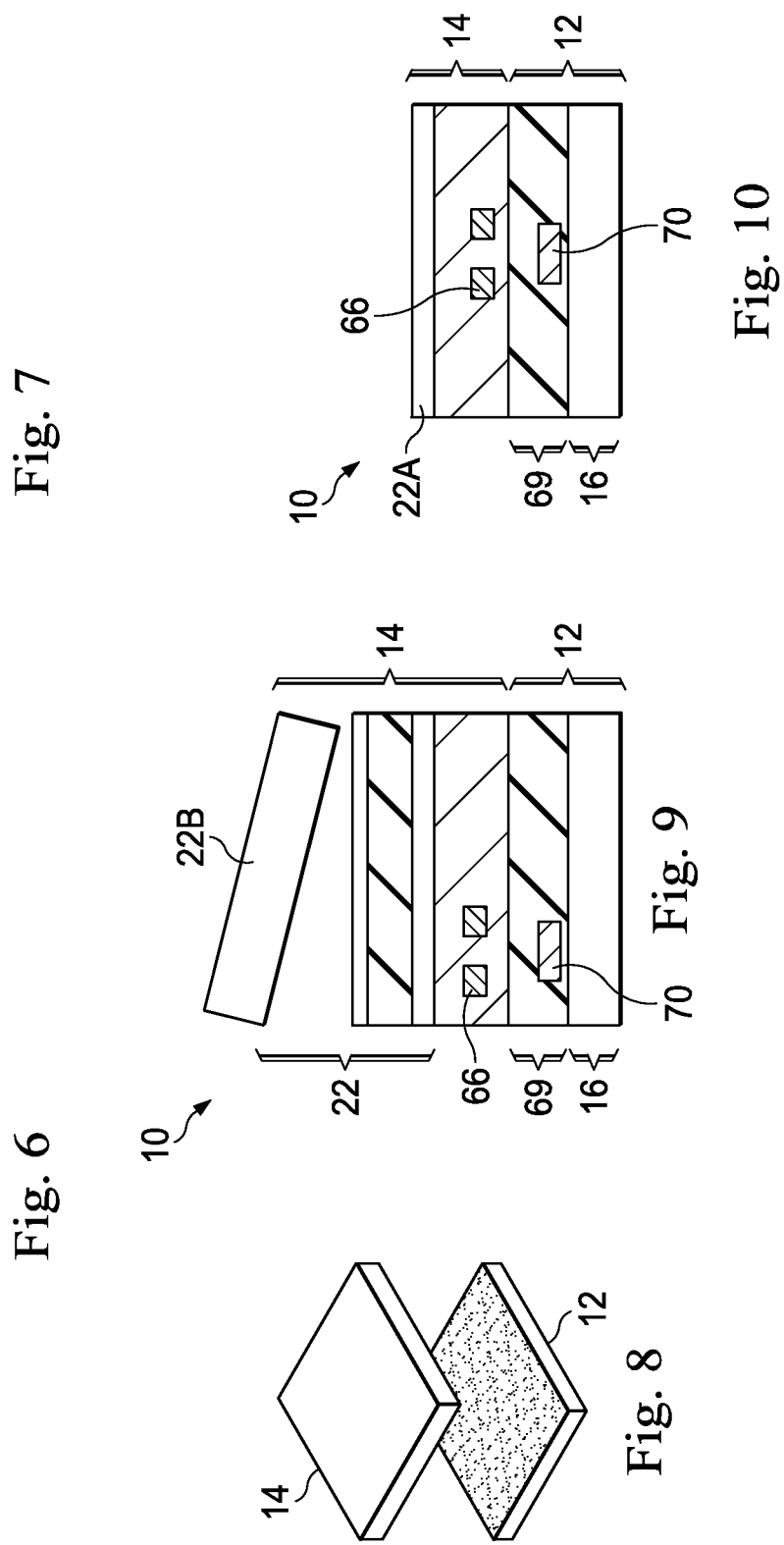

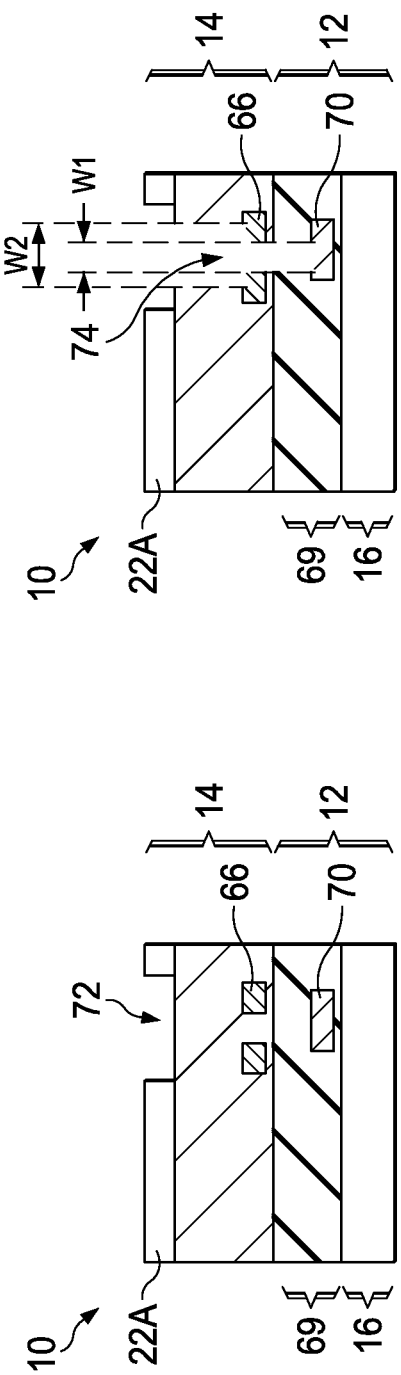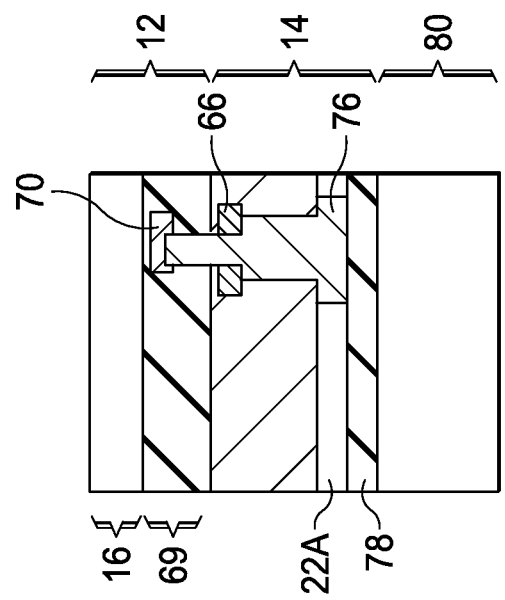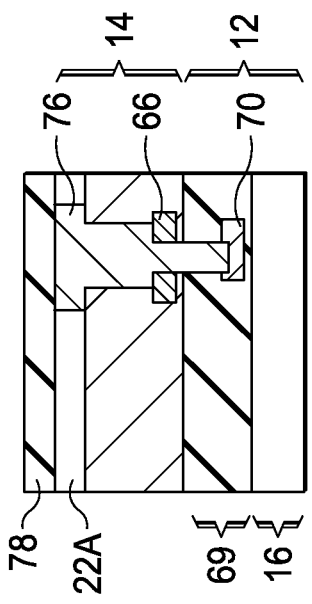

STRUCTURE AND METHOD FOR 3D IMAGE SENSOR

PRIORITY DATA

The present application is a continuation of U.S. application Ser. No. 15/383,924, filed Dec. 19, 2016, which is a continuation of U.S. application Ser. No. 14/739,514, filed Jun. 15, 2015, which is a continuation of U.S. application Ser. No. 14/143,848, filed Dec. 30, 2013, now U.S. Pat. No. 9,059,061, which claims priority to U.S. Provisional Application No. 61/799,113 entitled "3D CMOS IMAGE SENSOR," filed Mar. 15, 2013, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

As one application, imaging sensors are incorporated in an integrated circuit. The existing imaging sensor has logic and pixel array on the same Si wafer and another wafer is a carrier only. Various issues may present in the existing imaging sensor structure. In one example, process tuning to image sensors impacts logic circuit area. In another example, small pixel layout suffers low quantum efficiency (QE) and full well capacity (FWC) due to devices occupancy. In yet another example, image signal processor (ISP) seizes a larger layout area, leading to low gross die count per unit area.

Therefore, what is needed is a structure for imaging sensor and method making the same to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 1 and 2 illustrate an imaging sensor structure in a top view and a schematic view, respectively, constructed according to various embodiments.

FIGS. 6 and 7 illustrate sectional views of a logic circuit chip at various fabrication stages constructed according to one or more embodiment.

FIG. 8 illustrates a schematic view of the logic circuit structure and an image sensor chip constructed according to one embodiment.

FIGS. 9-14 illustrate sectional views of the imaging sensor structure at various fabrication stages constructed according to one or more embodiments.

DETAILED DESCRIPTION

Figure 3:
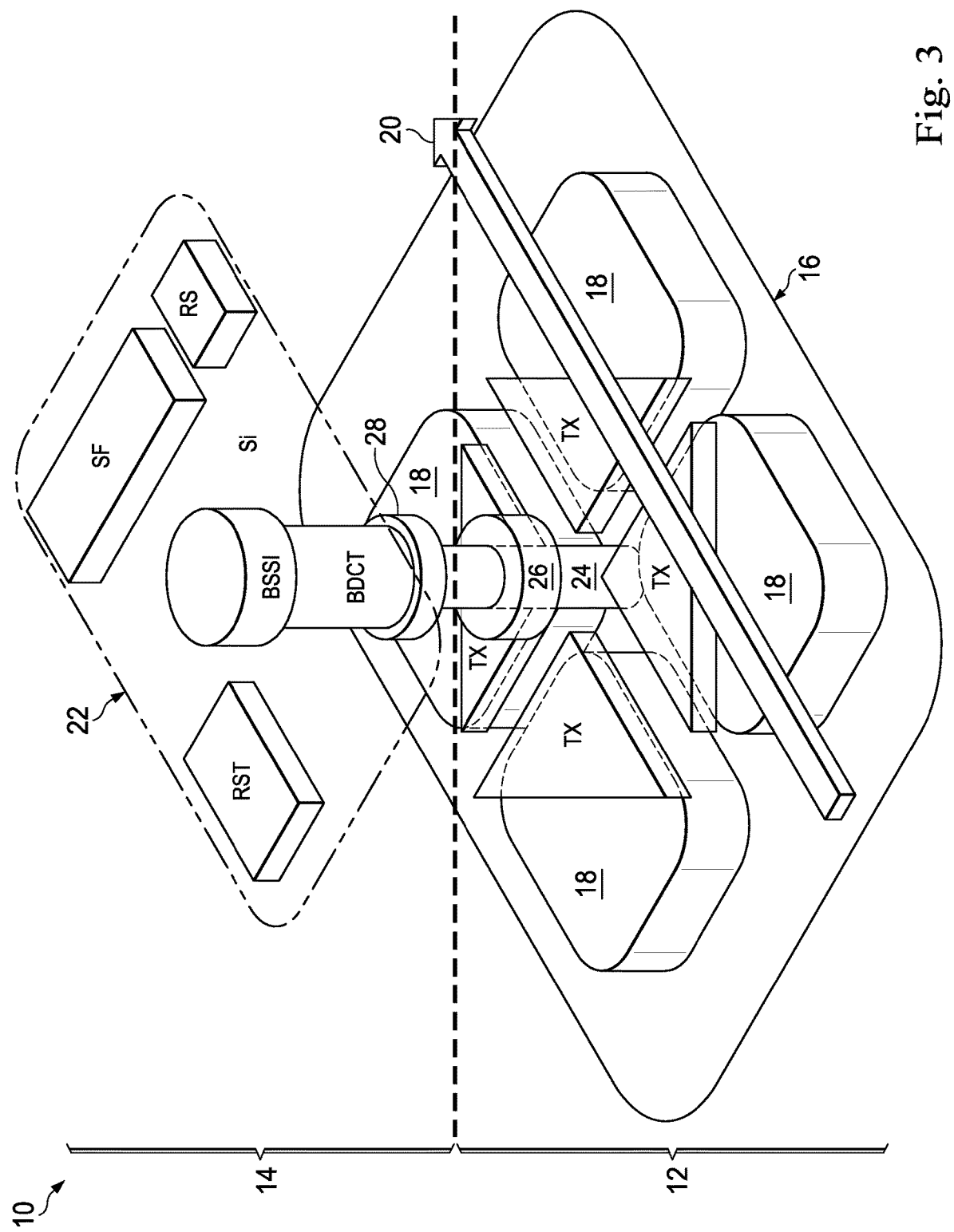
FIG. 3 illustrates a schematic view of the imaging sensor structure constructed according to another embodiment.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides an imaging sensor structure and the method making the same with improved pixel performance, increased gross die count and enhanced image signal processor (ISP) function.

FIG. 1 illustrates a top view of an image sensor structure 10 and FIG. 2 illustrates a schematic view of the image sensor structure 10. The image sensor structure 10 has a three dimensional (3D) structure that includes a first integrated circuit (IC) chip 12 and a second IC chip 14. The IC substrate 14 is stacked on, mechanically bonded to, and electrically coupled with the first IC chip 12. The first IC chip 12 is designed and configured to form various image sensors and the second IC chip 14 is designed and configured to form various driving circuit and logic devices to the image sensors. The first and second IC chips are also referred to as image sensor chip and logic circuit chip, respectively.

The first IC chip 12 includes a first substrate. In one embodiment, the first substrate includes silicon. The first substrate may additionally or alternatively include some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The first IC chip 12 includes various doped regions, and other features configured to form image sensors that are sensitive to photon or other image radiation. In one embodiment, the image sensors include photodiodes, such as complementary metal-oxide-semiconductor field-effect transistor (CMOSFET)-based photodiodes or other photosensitive devices. In one embodiment, those image sensors are further configured to form an image sensor array for various applications including imaging. In one example, the image sensors are backside illuminated CMOSFET-based image sensors, where the illumination beam is received from the backside of the image sensors. Accordingly, the first IC chip 12 is also referred to as image sensor chip 12. The first IC chip 12 includes conductive material features and dielectric material features disposed on the first substrate and configured for coupling and isolating various microelectronic components, respectively. As one example, the first IC chip 12 includes one or more material layers, such as interleave dielectric material layers (ILDs) and metal layers that are embedded in the ILDs and are patterned to form metal lines, vias and contacts. In another embodiment, the first IC chip 12 may further include other microelectronic devices.

The second IC chip 14 includes a second substrate. In the present embodiment, the second substrate is substantially similar to the first substrate. In one example, the second substrate includes silicon. In other examples, the second substrate alternatively or additionally includes some other suitable elementary semiconductor, a suitable compound semiconductor, or a suitable alloy semiconductor.

The second IC chip 14 includes various microelectronic devices, such as CMOSFET-based logic devices and circuits. Particularly, the second IC chip 14 includes various microelectronic devices configured to form driving circuits/devices for the image sensors. In one embodiment, the driving circuits to the image sensors include address lines and data lines to the image sensor array. The driving circuits to the image sensors further include driving devices reset (RST) device, source follower (SF), and row selector (RS). In the present embodiment, those driving devices are configured in group to be coupled with one pixel of the image sensors or a subset of the pixels. Various circuits and devices formed in the second IC chip 14 are collectively referred to as logic devices in the later description. In one example, the second IC chip is an application-specific integrated circuit (ASIC) chip.

The first IC chip 12 and the second IC chip 14 are mechanically bonded together through a suitable bonding mechanism, such as fusion bonding, eutectic bonding or other suitable bonding technique. The first IC chip 12 and the second IC chip 14 are electrically coupled together through backside deep contact (BDCT) features. The BDCT features are formed in the deep trenches in the interconnect structure of the first IC chip 12, are further extended to the interconnect structure of the second IC chip 14, are configured with other conductive features to electrically couple together the driving devices in the second IC chip 14 and the image sensors in the first IC chip 12. The BDCT features will be further described later in terms of the formation and configuration. Since the image sensors and the corresponding driving circuits/devices are distributed into two IC chips (12 and 14 in the present embodiment), there are more freedom and flexibility to reconfigure and tune the image sensors and the driving circuits/devices for improved performance and efficiency. For example, the image sensors and the logic devices are individually tuned for their performance during the respective fabrication operations before bonding and coupling together. In the present embodiment, the 3D image sensor structure 10 is formed by a procedure where the first IC chip 12 and the second IC chip 14 are fabricated and bonded in wafer level and thereafter are diced to separate a plurality of the 3D image sensor structures 10.

FIG. 3 illustrates a schematic view of the 3D image sensor structure 10 constructed according to aspects of the present disclosure in another embodiment. The 3D image sensor structure 10 includes the first IC chip 12 and the second IC chip 14 mechanically bonded together and electrically coupled with each other. The first IC chip 12 is designed and configured to form various image sensors and the second IC chip 14 is designed and configured to form various logic circuits that include driving circuit/devices to the image sensors.

The first IC chip 12 includes a first substrate 16. In one embodiment, the first substrate includes silicon. The first substrate may additionally or alternatively include some other suitable elementary semiconductor; a suitable compound semiconductor; or a suitable alloy semiconductor.

The first IC chip 12 includes various doped regions, and other features configured to form image sensors 18 that are sensitive to photon or other image radiation. In one embodiment, the image sensors 18 include photodiodes, such as CMOSFET-based photodiodes or other photosensitive devices. In one example, the image sensors are backside illuminated CMOSFET-based image sensors. In the present embodiment, the first IC chip 12 also includes other features, such as transfer gates ("TX" in FIG. 3) formed on the photodiodes 18, respectively. The first IC chip 12 includes an interconnect structure (also referred to as a first interconnect structure) formed on the first substrate 16. The first interconnect structure includes metal lines, vias and contacts to provide horizontal and vertical electrical routing. The interconnect structure may include a plurality of metal layers, such as a first metal layer ("M1"), a second metal layer ("M2"), . . . and so on. The first interconnect structure includes various conductive features configured to an electrical routing 20 to provide electrical routing to the transfer gates.

The second IC chip 14 includes a second substrate 22. In the present embodiment, the second substrate 22 is substantially similar to the first substrate 16. For examples, the second substrate includes silicon.

The second IC chip 14 includes various microelectronic devices, such as CMOSFET-based logic devices formed on the second substrate 22. Particularly, the second IC chip 14 includes various microelectronic devices configured to drive the image sensors 18. In one embodiment, the driving devices to the image sensors include reset (RST) device, source follower (SF), and row selector (RS). In the present embodiment, those driving devices are configured in pixel levels such that a group of those devices are coupled with one pixel of the image sensors 18 or a subset of pixels in the image sensor array. Accordingly, the coupling between the driving devices to the image sensors are pixel-based and the conductive features to connect both need to be properly designed and configured to provide such capability with chip area efficiency.

The second IC chip 14 also includes an interconnect structure (also referred to as a second interconnect structure) formed on the second substrate 22. The second interconnect structure includes a plurality of metal layers, such as a first metal layer, a second metal layer, . . . and the top metal ("TM"). One of the metal lines in the top metal layer is illustrated in FIG. 3.

The first IC chip 12 and the second IC chip 14 are mechanically bonded together through a suitable bonding mechanism. The first IC chip 12 and the second IC chip 14 are electrically coupled together through one or more backside deep contact ("BDCT" in FIG. 3) feature. The BDCT feature is formed in the deep trenches in the interconnect structure of the first IC chip 12, further extended to the interconnect structure of the second IC chip 14, and configured with other conductive features to electrically couple together the driving devices in the second IC chip 14 and the image sensors 18 in the first IC chip 12.

The BDCT feature has a small dimension in a top view toward the first or second substrate since it is pixel-based with small footprint. In one example, the dimension of the BDCT feature is less than 1 micron. Particularly, the BDCT feature is extended from the contact feature 24 of the first interconnect structure in the first substrate 16 to a conductive feature (referred to as "BSSI" feature in FIG. 3) formed in the second substrate 22. The BSSI feature is embedded in the second substrate 22 and formed by backside silicon (BSSI) etch. The BDCT feature is extended through a first metal line in the first metal layer ("M1") and a second metal line in the top metal ("TM") layer of the second interconnect structure. In the present embodiment, the BDCT has different dimensions in different portions. The BDCT includes a first portion between the BSSI feature and the second metal line, and a second portion between the second metal line and the first metal line. The first portion has a first dimension (first width) and the second portion has a second dimension (second width) greater than the first dimension, as illustrated in FIG. 3. This structure can be achieved by a procedure including multiple etchings.

Figure 4:
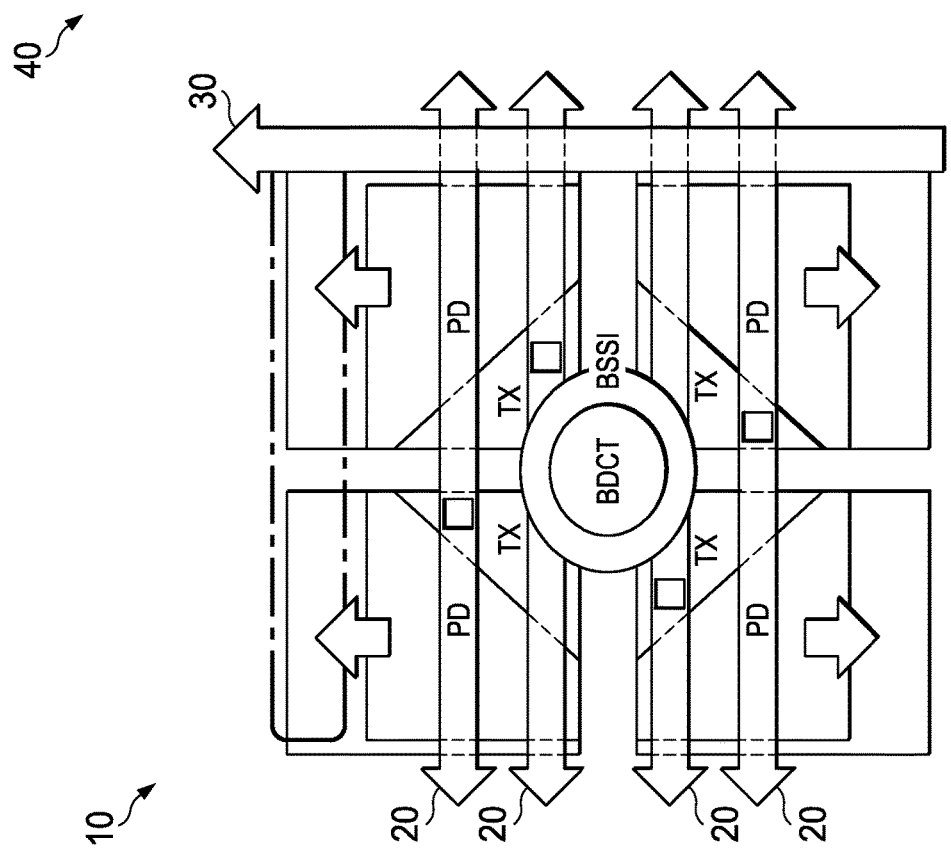
FIG. 4 illustrates a schematic view of the imaging sensor structure constructed according to another embodiment.

As noted above, the image sensors and the corresponding driving devices are respectively formed on two IC chips, with more freedom and flexibility to reconfigure and tune the image sensors and the driving devices for improved performance and efficiency. One such example of the 3D image sensor structure 10 is illustrated in FIG. 4 in a schematically top view. The 3D image sensor structure 10 includes photodiodes ("PD") and transfer gates ("TX") formed on the first IC chip. The first IC chip is mechanically bonded and is further electrically coupled with the second IC chip through the BDCT feature and BSSI feature. The BDCT and BSSI features are formed by a 3D procedure on the backside of the second IC chip, which will be further described later. The signal lines 20 and the ground line 30 to the photodiodes are configured on the pixel edges and are electrically coupled to the logic circuit/devices through BDCT feature in the 3D connection.

Figure 5:
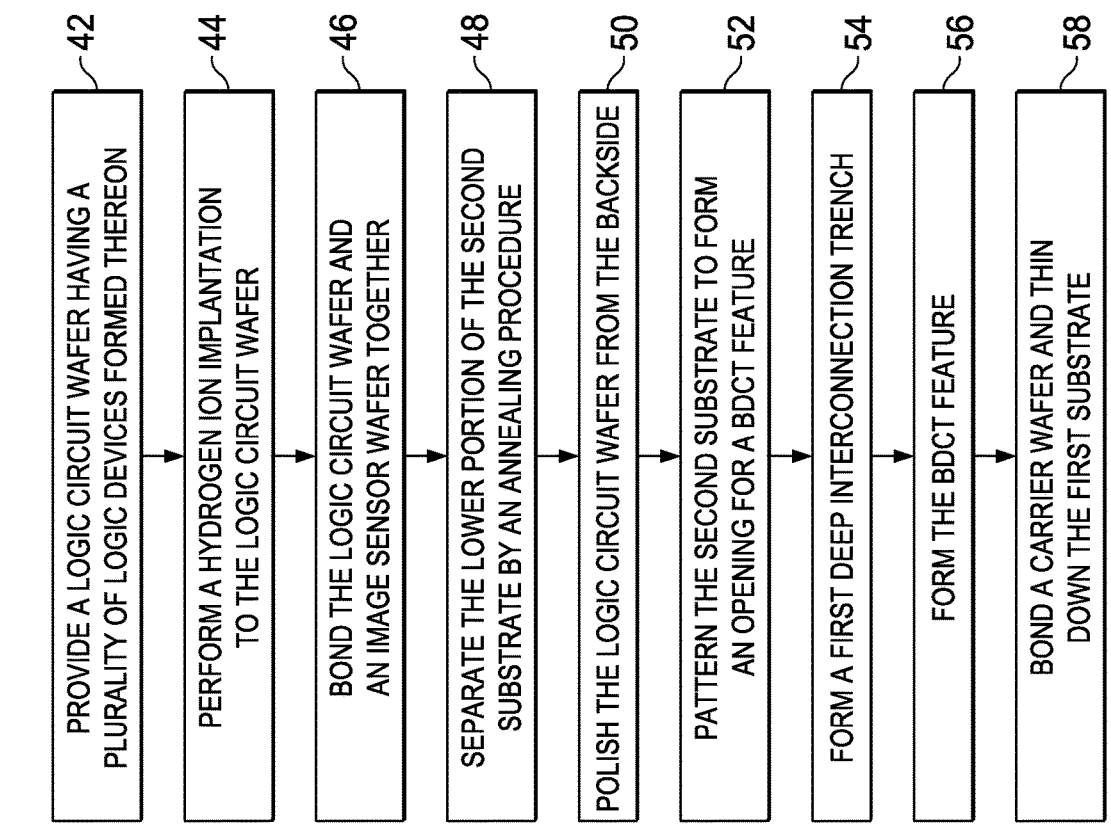
FIG. 5 is a flowchart of a method making the imaging sensor structure constructed according to one or more embodiment.

FIG. 5 is a flowchart of a method 40 making the 3D image sensor structure 10, and FIGS. 6-13 illustrates the 3D image sensor structure 10 at various fabrication stages constructed according one or more embodiment. As one embodiment, the present method 40 is implemented in wafer-level with more efficiency and various 3D image sensor chips are separated by dicing after the bonding and the formation of the electrical coupling features.

Referring to FIGS. 5 and 6, the method 40 begins at operation 42 by providing the second IC structure (logic circuit wafer in the present embodiment) 14. In the present embodiment, the second IC structure 14 is an ASIC chip and has a semiconductor-on-insulator (SOI) structure. Particularly, the second IC structure 14 includes a semiconductor substrate 22 (such as a silicon wafer) having an embedded a dielectric material layer 62. In the present example, the dielectric material layer 62 is a silicon oxide layer. The SOI structure of the second IC structure 14 is formed by a suitable technique, such as separation by implanted oxygen (SIMOX) or a procedure including oxidation, wafer bonding and thin-down. The semiconductor substrate 22 is separated to two portions an upper portion 22A and a lower portion 22B by the dielectric layer 62. The upper portion 22A functions as an active portion and various logic devices are formed in the upper portion 22A. For example, source and drain features of the CMOSFETs are formed in the upper portion 22A of the substrate 22.

The second IC structure 14 includes various logic devices formed on the substrate 22. The logic devices include CMOSFET-based devices that include the driving devices, such as RST, SF and RF, to be coupled to the image sensors.

The second IC structure 14 includes an interconnect structure 64 formed on the substrate 22. The interconnect structure 64 includes various metal lines (in respective metal layers), vias and contacts configured to provide electrical routing. The formation of the interconnect structure 64 includes a suitable procedure, such as damascene process for copper connection. In this method, the interlayer dielectric material layer is deposited, and patterned to form trenches using lithography process and etch. The metal, such as copper, is deposited to fill in the trenches and is further polished for removing excessive portion and planarizing the top surface by chemical mechanical polishing (CMP). The metal deposited to the trenches may include barrier layer (such as titanium nitride or tantalum nitride) by physical vapor deposition (PVD), copper seed layer by PVD and bulk copper by plating. In FIG. 6, metal features 66 in the top metal layer are illustrated.

Referring to FIGS. 5 and 7, the method 40 proceeds to operation 44 by performing an ion implantation to the substrate 22, thereby forming an implanted layer 68 in the interface between the dielectric layer 62 and the lower portion 22B of substrate 22, as illustrated in FIG. 7. In the present embodiment, the implantation species is hydrogen. The ion implantation process is tuned with various parameters including dose and energy in order to achieve a smart cut at a later fabrication stage. Particularly, the ion implantation process is applied to the substrate 22 without using an implantation mask to block certain areas since it is not intended to form a portion of the logic circuit. Instead, it is intended to achieve the smart cut.

Referring to FIGS. 5, 8 and 9, the method 40 proceeds to operation 46 by bonding the second IC structure (logic circuit wafer) 14 to the first IC structure (image sensor wafer) 12 together, resulting in a bonded 3D image sensor structure 10. The first IC structure 12, as described above, includes a plurality of photosensitive devices, such as photodiodes, formed thereon. The image sensor structure 12 includes a semiconductor substrate 16, such as a silicon wafer. The image sensor structure 12 includes a first interconnect structure 69 having various metal lines, vias and contacts. A metal line 70 in the first metal layer of the first interconnect structure is illustrated in FIG. 9. The bonding process is designed to bond the two IC chips in a configuration such that the first interconnect structure of the first IC structure 12 and the second interconnect structure of the second IC structure 14 are sandwiched between the two substrates 16 and 22. The bonding process may implement a suitable bonding mechanism, such as fusion bonding, eutectic bonding, or other boning technique.

Still referring to FIGS. 5 and 9, the method 40 proceeds to operation 48 by separating the lower portion 22B of the second substrate 22 from the 3D image sensor structure 10 by an annealing procedure. In the present embodiment, the annealing procedure includes a two-phase annealing: a first annealing and a second annealing. The first annealing is designed to separate the lower portion 22B of the second substrate 22. Particularly, the first annealing includes an annealing temperature of about 500° C. The first annealing causes the crystalline rearrangement and coalescence of the implanted layer 68. During the first annealing, the micro cavities in the implanted layer 68 are growing in sizes and the pressure builds up in the growing cavities, causing the lower portion 22B split from the 3D image sensor structure 10.

The second annealing is designed to enhance the bonding strength between the first and the second IC structures 12 and 14. In the present embodiment, the second annealing has a second annealing temperature of about 1100° C.

Referring to FIGS. 5 and 10, the method 40 proceeds to operation 50 by polishing the second substrate 22 from the backside. In the present embodiment, the dielectric layer 62 is removed and the corresponding outside surface is planarized by polishing, such as by CMP.

Referring to FIGS. 5 and 11, the method 40 proceeds to operation 52 by patterning the second substrate 22 to form (one or more) opening that defines the region for the BDCT feature. Specifically, the upper portion 22A of the second substrate 22 is patterned to form a through opening 72 such that the second interconnect structure is exposed within the opening 72. The patterning process includes a lithography process and etching. In one example, the lithography process includes coating photoresist layer on the upper portion 22A; performing a lithography exposure to the photoresist layer; and developing the exposed photoresist layer to form a patterned photoresist layer. The etching is designed to selectively etch the upper portion 22A of the second substrate 22 (selectively etch silicon in the present embodiment where the upper portion 22A includes silicon). In another embodiment of patterning the second portion 22A, a hard mask may be employed. For example, a hard mask layer is deposited on the upper portion 22A, a patterned photoresist layer is formed by a lithography process, an etching process is applied to the hard mask layer using the patterned photoresist layer as an etch mask, and thereafter, another etching process is applied to the upper portion 22A using the patterned hard mask layer as an etch mask. In another example, the lithography process may include other suitable technologies, such as ultraviolet (UV) lithography, deep UV (DUV) lithography, extreme UV (EUV) lithography, or electron-beam lithography. In yet another example, the lithography process may be replaced by other suitable technologies, such as molecular imprint or maskless lithography.

Referring to FIGS. 5 and 12, the method 40 proceeds to operation 54 by forming one or more deep interconnect trench 74 for backend deep contact. The deep interconnect trench 74 vertically extends from the second IC structure 14 to the first IC structure 12. Especially, the deep interconnect trench 74 extends from the second interconnect structure of the second IC structure 14 to the first interconnect structure of the first IC structure 12. The deep interconnect trench 74 includes a first trench portion and a second trench portion with different dimensions. The first trench portion vertically spans between the metal line 70 in the first metal layer of the first interconnect structure and the metal line 66 in the top metal layer of the second interconnect structure. The second trench portion is in the second IC structure and vertically spans from the metal line 66 in the top metal layer of the second interconnect structure to the second substrate 22. In the present example, the first trench portion has a first horizontal dimension (first trench width) W1 and the second trench portion has a second horizontal dimension (second trench width) W2 greater than W1, thereby providing more room for the image sensors in the first IC chip 12.

The deep interconnect trench 74 is aligned with the metal lines 66 and 70, and therefore electrically couple the metal lines 66 and 70 together by the BDCT feature to be formed, thereby providing the electrical interconnection between the first and second IC chips, particularly providing the electrical interconnection between the image sensors in the first IC structure 12 and the logic devices in the second IC structure 14.

The formation of the deep interconnect trench 74 includes various etching processes. Since the second interconnect structure includes various metal features formed in one or more interlayer dielectric (ILD) material layers. The ILD material layers includes a suitable dielectric material, such as silicon oxide, silicon nitride, silicon oxynitride, polyimide, spin-on glass (SOG), fluoride-doped silicate glass (FSG), carbon doped silicon oxide, and low k dielectric material. The etching processes are designed to selectively etch the ILD material layers.

In one embodiment, the formation of the deep interconnect trench is similar to the dual damascene process, such as via-first dual damascene process, trench-first dual damascene process or other suitable dual damascene process. In furtherance of the embodiment, the metal lines 66 and 70 may serve as etch stop layers in the etch processes to form the first and second trench portions, respectively.

The formation of the deep interconnect trench 74 in a particular example is described below. The first etch process is applied to the ILD layers to form the second trench portion of the deep interconnect trench 74 through the opening 72 in the upper portion 22A of the second substrate 22 using the upper portion 22A as an etch mask. The opening 72 may be expanded to a large size during the first etch process. The first etch process is designed with an etchant to selectively remove the dielectric material of the ILD material layers and to stop on the metal line 66. A second etch process is applied to the metal line 66 to open the metal line 66 within the trench. Thereafter, a processing procedure including lithography process and etch is applied to form the first trench portion. In the processing procedure, a patterned photoresist layer is formed on the upper portion 22A of the second substrate 22 and in the second trench portion by a lithography process. The lithography process includes photoresist coating, exposure and developing, and may further include various baking steps, such as soft baking, post exposure baking and hard baking. The patterned photoresist layer includes an opening that defines the region for the first trench portion. A third etching process is applied to etch the ILD dielectric material layer of the second interconnect structure and the ILD dielectric material layer of the first interconnect structure. In one example, the third etching process is similar to the first etching process in terms of the etchant and etches selectivity. In furtherance of the example, the third etching process stops on the metal line 70. Other suitable procedure that is able to form the deep interconnect trench 74 may be implemented. For example, additional etch stop layer may be formed on the metal lines 70 (or 66) to stop the corresponding etch process for forming the first trench portion (or the second trench portion), to enhance the etch control.

Referring to FIGS. 5 and 13, the method 40 proceeds to operation 56 by forming the BDCT feature 76. In one embodiment, the formation of the BDCT feature 76 is similar to the formation of metal features by the dual damascene process. In furtherance of the embodiment, the formation of the BDCT feature 76 includes filling the deep interconnect trench 74 with one or more conductive material; and performing a chemical mechanical polishing (CMP) process to remove the excessive metal deposited on the substrate 22A and planarize the top surface. In various examples, the conductive material includes metal or metal alloy, such as copper, tungsten, metal silicide, aluminum or other suitable conductive material. In another example, the conductive material may include more than one material layers. The conductive material may be deposited by a suitable technique, such as physical vapor deposition (PVD), plating, chemical vapor deposition (CVD). In the present example, the BDCT feature 76 includes a barrier layer, such as titanium nitride or tantalum nitride deposited by PVD; a copper seed layer formed on the barrier layer by PVD; and bulk copper to fill in the deep interconnect trench by plating.

In the present embodiment, during the formation of the BDCT feature 76, the opening 72 of the substrate 22A is also filled with the conductive material, thereby forming another conductive portion in the opening 72. The portion of the conductive material in the opening 72 is collectively labeled by numeral 76 in FIG. 13 (it is also referred to as the BSSI feature in FIG. 3).

Additionally, a passivation layer 78 is formed on the substrate 22A and the BDCT feature 76. The passivation layer 78 includes a suitable material for passivation, such as a silicon oxide layer, a silicon nitride or a combination thereof, formed by a suitable method, such CVD.

Referring to FIGS. 5 and 14, the method 40 may include an operation 58 by bonding a carrier substrate 80 (such as another silicon wafer) to the 3D image sensor structure 10 if it is too thin without enough mechanical strength. In one example, the upper portion 22A of the second substrate 22 is too thin. The carrier substrate 80 is boned to the second substrate to the passivation layer 80 by a suitable bonding mechanism, such as fusion bonding or eutectic bonding. In another embodiment, after the bonding of the carrier substrate 80, the first substrate 16 is thinned down from the backside such that the thickness of the first substrate 16 is substantially reduced. Thereby, the image sensors formed in the first substrate 16 are able to receive image light more efficiently with reduced energy loss.

The method 40 may further include other operations to complete the formation of the 3D image sensor structure 10. In one example, the method 40 may include forming various features to enhance the imaging effect of the image sensors, such as forming color filter and micro-lenses on the backside of the first substrate. In another example, the method 40 may include a dicing process to form a plurality of 3D image sensor chips when the above operations are implemented in wafer level.

The present disclosed 3D image sensor structure and the method making the same are described in various embodiments. Other alternative embodiments may present without departure from the spirit of the present disclosure. In one embodiment, the carrier wafer as the third substrate bonded to the 3D image sensor structure includes other logic circuit for further ISP function enhancement. For example, various logic devices including the driving devices to the image sensors are properly distributed in the logic substrate and the carrier wafer for more configuration freedom and design flexibility to enhance the performance of the 3D image sensor structure. In another embodiment of the disclosed structure and method, the driving devices to the image sensors are relocated on the logic substrate for image sensor performance improvement, such as the enlargement of quantum efficiency (QE) and full well capacity (FWC). In yet another embodiment, the image sensors in the 3D image sensor structure may be replaced by other sensors to employ the advantages of the 3D structure. In yet another embodiment, the metal line 70 of the 3D image sensor structure 10 may be a metal line in another metal layer, such as second metal layer.

Different advantages may present in various embodiments. In one embodiment, image sensor pixel performance is improved through a fine-tuning process regardless of logic circuit since the logic circuit is independently formed in the logic circuit wafer before bonding to the image sensor wafer. Accordingly, gross dies (the number of working dies) increases relative to those in the existing approach. Other advantages includes ISP function enhancement, and easy to extend to next generation process in various embodiments.

Thus, the present disclosure provides an embodiment of an image sensor structure. The image sensor structure includes a first semiconductor substrate having a plurality of imaging sensors; a first interconnect structure formed on the first semiconductor substrate; a second semiconductor substrate having a logic circuit; a second interconnect structure formed on the second semiconductor substrate, wherein the first and the second semiconductor substrates are bonded together in a configuration that the first and second interconnect structures are sandwiched between the first and second semiconductor substrates; and a backside deep contact (BDCT) feature extended from the first interconnect structure to the second interconnect structure, thereby electrically coupling the logic circuit to the image sensors.

The present disclosure also provides another embodiment of a three dimensional (3D) image sensor structure. The 3D image sensor structure includes a first integrated circuit (IC) chip having a plurality of imaging sensors formed in a first silicon substrate and a first interconnect structure formed on the first silicon substrate; a second IC chip having a logic circuit formed in a second silicon substrate and a second interconnect structure formed on the second silicon substrate, wherein the first and second IC chips are mechanically bonded together in a configuration that the first and second interconnect structures are sandwiched between the first and second silicon substrates; and a backside deep contact (BDCT) feature extended from the first interconnect structure to the second interconnect structure, thereby electrically coupling the logic circuit to the image sensors.

The present disclosure also provides one embodiment of a method for fabricating a three dimensional (3D) image sensor structure. The method includes providing a logic substrate having a logic circuit formed therein and a first interconnect structure formed thereon, wherein the logic substrate has a silicon on insulator (SOI) structure; performing a hydrogen ion implantation process to the logic substrate, thereby forming a hydrogen implanted layer in the logic substrate; bonding the logic substrate to an image sensor substrate having image sensors formed therein and a second interconnect structure formed thereon; performing an annealing process, thereby achieving a smart cut to the logic substrate; performing an etching process to form a deep interconnect trench continuously extending from the logic substrate to the first interconnect structure; and forming a backside deep contact (BDCT) feature in the deep interconnect trench, thereby electrically coupling the logic circuit to the image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   performing an ion implantation process on a first substrate to form an implant layer in the first substrate, wherein a first interconnect structure is disposed over the first substrate;

coupling the first substrate to a second substrate, wherein a second interconnect structure is disposed over the second substrate;

removing a portion of the first substrate that includes the implant layer;

forming a trench extending through the first substrate, the first interconnect structure, and to the second interconnect structure; and forming a conductive feature in the trench.

2. The method of claim 1, wherein the first substrate includes a dielectric layer and a semiconductor layer prior to performing the ion implantation process on the first substrate, and wherein the first substrate includes the dielectric layer, the semiconductor layer and the implant layer positioned between the dielectric layer and the semiconductor layer after the performing of the ion implantation process on the first substrate.

3. The method of claim 1, wherein the removing of the portion of the first substrate that includes the implant layer includes performing an annealing process.

4. The method of claim 3, wherein the performing of the annealing process includes performing a first annealing process at a first temperature and performing a second annealing process at a second temperature that is different than the first temperature.

5. The method of claim 4, wherein the first temperature is less than the second temperature, and wherein the first annealing process is performed prior to the second annealing process.

6. The method of claim 1, wherein the removing of the portion of the first substrate that includes the implant layer includes performing an annealing process and a chemical mechanical polishing process.

7. The method of claim 1, wherein the performing of the ion implantation process on the first substrate to form the implant layer in the first substrate occurs without using an implantation mask.

8. A method comprising:

performing a hydrogen ion implantation process on a first substrate to form a hydrogen layer therein, wherein a first interconnect structure is disposed over the first substrate;

coupling the first substrate to a second substrate, wherein a second interconnect structure is disposed over the second substrate;

removing a portion of the first substrate that includes the hydrogen layer;

forming a trench extending from the first interconnect structure to the second interconnect structure; and forming a contact feature in the trench.

9. The method of claim 8, wherein the removing of the portion of the first substrate that includes the hydrogen layer occurs after the coupling of the first substrate to the second substrate.

10. The method of claim 8, further comprising:

forming a passivation layer directly on the contact feature; and coupling a third substrate to the passivation layer.

11. The method of claim 8, wherein the removing of the portion of the first substrate that includes the hydrogen layer includes performing a first annealing process and a second annealing process that is different than the first annealing process.

12. The method of claim 11, wherein the removing of the portion of the first substrate that includes the hydrogen layer further includes performing a polishing process.

13. The method of claim 8, wherein the first substrate includes a first semiconductor layer, a dielectric layer disposed over the first semiconductor layer, the hydrogen layer disposed over the dielectric layer and a second semiconductor layer disposed over the hydrogen layer after the performing of the hydrogen ion implantation process on the first substrate, wherein the removing of the portion of the first substrate that includes the hydrogen layer includes removing the second semiconductor layer, the hydrogen layer and the dielectric layer to expose a portion of the first semiconductor layer.

14. A method comprising:

providing a first substrate and a second substrate, the first substrate including a dielectric layer and a semiconductor layer disposed on the dielectric layer;

performing an ion implantation process on the first substrate to form an implant layer in the first substrate, wherein the implant layer interfaces with the dielectric layer and the semiconductor layer, wherein a first interconnect structure is disposed over the first substrate;

coupling the first substrate to the second substrate, wherein a second interconnect structure is disposed over the second substrate;

removing at least a portion of the semiconductor layer to expose a portion of the implant layer;

removing the exposed portion of the implant layer;

forming a trench extending through the first substrate, the first interconnect structure, and to the second interconnect structure; and forming a conductive feature in the trench.

15. The method of claim 14, wherein the removing of the exposed portion of the implant layer further includes removing the dielectric layer from the first substrate, and wherein the first substrate further includes another semiconductor layer, and wherein the another semiconductor layer is exposed after the removing of the dielectric layer from the first substrate.

16. The method of claim 14, wherein the removing of the at least the portion of the semiconductor layer to expose the portion of the implant layer includes performing a thermal treatment process.

17. The method of claim 16, wherein the performing of the thermal treatment process includes performing a first annealing process at a temperature of about 500° C.

18. The method of claim 17, wherein the performing of the thermal treatment process includes performing a second annealing process at a temperature of about 1100° C., wherein the second annealing process occurs after the first annealing process.

19. The method of claim 14, wherein the performing of the ion implantation process occurs without using an implantation mask, and wherein the performing of the ion implantation process on the first substrate to form the implant layer includes performing a hydrogen ion implantation process.

20. The method of claim 14, wherein the conductive feature extends though the first substrate, the first interconnect structure, and the second interconnect structure, wherein the conductive feature has a first width in the first substrate, wherein the conductive feature has a second width in the first interconnect structure, the second width being different than the first width, and wherein the conductive feature has a third width in the second interconnect structure, the third width being different than the second width.

* * * * *